United States Patent [19]

Parish

[11] Patent Number: 5,688,841
[45] Date of Patent: Nov. 18, 1997

[54] ANTISTATIC AROMATIC POLYIMIDE FILM

[75] Inventor: Darrell Joe Parish, Circleville, Ohio

[73] Assignee: E. I. Du Pont de Nemours and Company, Wilmington, Del.

[21] Appl. No.: 681,584

[22] Filed: Jul. 29, 1996

[51] Int. Cl.$^6$ .................................................. C08K 9/00
[52] U.S. Cl. .......................... 523/216; 252/518; 428/404
[58] Field of Search ..................... 523/216; 428/404; 252/518

[56] References Cited

U.S. PATENT DOCUMENTS

| | | | |
|---|---|---|---|
| 4,373,013 | 2/1983 | Yoshizumi | 428/570 |
| 4,452,830 | 6/1984 | Yoshizumi | 427/215 |
| 5,324,766 | 6/1994 | Ikejiri | 524/433 |
| 5,512,350 | 4/1996 | Ryoke | 428/323 |

FOREIGN PATENT DOCUMENTS 63-20342  1/1988  Japan.

Primary Examiner—Paul R. Michl

[57] ABSTRACT

An antistatic aromatic polyimide film containing from 14 to 50% by weight of electrically conductive silica particles coated with a layer of antimony-containing tin oxide and having a surface resistivity ranging from $10^4$ to $10^{12}$ ohms/square. The polyimide film exhibits excellent antistatic properties even after heat-treatment at high temperatures of 400° C. or above, while maintaining good heat resistance and mechanical properties. The polyimide film can be used in various applications requiring good antistatic properties such as copier belts, space blankets and flexible circuit substrates.

14 Claims, No Drawings

ANTISTATIC AROMATIC POLYIMIDE FILM

BACKGROUND OF THE INVENTION

1. Field of the Invention

The present invention relates to an antistatic aromatic polyimide film. More particularly, the present invention relates to an aromatic polyimide film having improved antistatic properties, while maintaining good heat resistance and mechanical properties, obtained by incorporating electrically conductive antimony-tin oxide coated silica particles in the polyimide polymer matrix.

2. Description of the Prior Art

Polymer films, including aromatic polyimide films, exhibit a marked propensity towards generation of static electricity, which undesirably attracts dust and dirt to the film surface. In addition, electric shocks can occur due to this accumulated static electricity. Slip properties of the film are also reduced which affects running properties and causes problems in film handling.

In order to solve these problems, various proposals have been made for imparting antistatic properties to the polymer film. For example, adding to or coating a conductive material, such as carbon black, on the film or by incorporating into or coating an antistatic agent on the film. However, these methods have serious drawbacks. In the first case, a large amount of the conductive material, such as carbon black, usually must be added to the film to obtain the requisite antistatic properties. The resultant films are undesirably black in color and tend to have reduced mechanical strength thereby compromising commercial value. Furthermore, coatings filled with carbon black have a tendency to slough and thereby contaminate their surroundings with black, conductive debris.

In the latter case, conventional antistatic agents are typically organic in nature and are easily decomposed at the elevated temperatures of 400° C. or above required to convert the polyamic acid precursor to the polyimide and are hardly able to provide the required antistatic properties to the film.

U.S. Pat. Nos. 4,373,013 and 4,452,830 disclose an electroconductive powder having a structure comprising titanium oxide particles coated with a layer of antimony-containing tin oxide suitable for forming the electroconductive layers of electro-thermosensitive papers and for use as an antistatic agent in resin films.

Japanese Patent No. SHO 63(1988)-20342 discloses electroconductive mica particles coated with a tin oxide-antimony oxide mixture.

The aromatic polyimide film of the invention is free from the above-mentioned drawbacks and provides improved antistatic properties. In a preferred embodiment, these improved antistatic properties are maintained even if the process for preparing the film requires a high temperature heat treatment on the order of 400° C. or above.

SUMMARY OF THE INVENTION

According to the present invention there is provided an antistatic aromatic polyimide film comprising an aromatic polyimide film having dispersed therein from 14 to 50% by weight, based on the weight of the polyimide, of electrically conductive silica particles coated with a layer of antimony-containing tin oxide wherein the amount of antimony ranges from 1 to 20% by weight of the tin oxide to provide a surface resistivity of from $10^{14}$ to $10^{12}$ ohms/square.

The antistatic aromatic polyimide film of the present invention exhibits excellent antistatic properties (surface resistivity of $10^4$ to $10^{12}$ ohms/square) even after it is subjected to a heat treatment at high temperatures of 400° C. or above, e.g. 400° C. for 5 minutes, while maintaining its good heat resistance and mechanical properties.

DETAILED DESCRIPTION OF THE INVENTION

The present invention provides an antistatic polymer composition which includes an aromatic polyimide matrix polymer and an electrically conductive filler material incorporated in the polyimide matrix polymer in an amount sufficient to provide the polymer composition with an electrical conductivity of from $10^4$ to $10^{12}$ ohms/square. The electrically conductive filler material is intrinsically silica particles coated with a conductive layer of antimony-containing tin oxide. These preferred compositions are, for example, suitable for the fabrication of copier printer belts, space blankets and flexible circuits. In addition, the relatively high dielectric constant of the higher loaded films make them useful as capacitor substrates.

The antistatic polymer compositions of the present invention are prepared by incorporating the antimony-containing tin oxide coated silica particles into an aromatic polyimide matrix polymer or prepolymer to provide an electrically conductive polymer composition. Those skilled in the art will appreciate that incorporating the coated silica particles into the aromatic polyimide matrix polymer can be accomplished by any of a number of methods depending upon the nature of the aromatic polyimide matrix polymer and the intended application of the antistatic polymer composition. In general, the electrically conductive antimony-containing tin oxide coated silica particles are incorporated into the polyimide matrix polymer or prepolymer prior to final curing of the polymer or prepolymer. Exemplary antistatic polyimide polymer compositions of the invention include from about 14 weight % to about 50 weight % of the antimony-containing tin oxide coated silica particles.

The aromatic polyimide used as the matrix polymer in the present invention can be prepared by a known method employing an aromatic diamine component and an aromatic tetracarboxylic acid component. For example, the aromatic diamine component and the aromatic tetracarboxylic acid component are polymerized, preferably in substantially equimolar amounts, in an organic polar solvent to prepare an organic polar solvent solution of an aromatic polyamic acid, and then the aromatic polyamic acid in the solution is imidized to prepare an aromatic polyimide.

Examples of aromatic diamine components include benzene diamines such as 1,4-diaminobenzene, 1,3-diaminobenzene and 1,2-diaminobenzene, diphenyl (thio) ether diamines such as 4,4'-diaminodiphenyl ether, 3,4'-diaminodiphenyl ether, 3,3'-diaminodiphenyl ether, 1,3-bis (4-aminophenoxy)-benzene, 1,4-bis(4-amino-phenoxy)-benzene, 1,2-bis(4-aminophenoxy)benzene, and 4,4'-diaminodiphenyl thioether, benzophenone diamines such as 3,3'-diaminobenzophenone and 4,4'-diamino-benzophenone, diphenylphosphine diamines such as 3,3'-diaminodiphenylphosphine and 4,4'-diaminodiphenylphosphine, diphenylalkylene diamines such as 3,3'-diaminodiphenylmethane, and 4,4'-diaminodiphenylmethane, 3,3'-diaminodiphenylpropane and 4,4'-diaminodiphenyl-propane, diphenylsulfide diamines such as 3,3'-diamino-diphenylsulfide and 4,4'-diamino-diphenylsulfide, diphenylsulfone diamines such as 3,3'-diaminodiphenyl-sulfone and 4,4'-diaminodiphenyl-sulfone, and benzidines such as benzidine and 3,3'-dimethylbenzidine.

These aromatic diamines can be used alone or in combination. A preferred aromatic diamine for use in the present invention is 4,4'-diaminodiphenyl ether.

As the aromatic tetracarboxylic acid component, there can be mentioned aromatic tetracarboxylic acids, acid anhydrides thereof, salts thereof, and esters thereof. Examples of the aromatic tetracarboxylic acids include 3,3',4,4'-biphenyltetracarboxylic acid, 2,3,3',4'-biphenyltetracarboxylic acid, pyromellitic acid, 3,3',4,4'-benzophenonetetracarboxylic acid, 2,2-bis(3,4-dicaboxyphenyl)propane, bis(3,4-dicarboxy-phenyl) methane, bis(3,4-dicarboxyphenyl)ether, bis(3,4-dicarboxyphenyl)thioether, bis(3,4-dicarboxyphenyl)phosphine, and bis(3,4-dicarboxyphenyl) sulfone.

These aromatic tetracarboxylic acid components can be used alone or in combination. Preferred is an aromatic tetracarboxylic dianhydride and, particularly preferred, are pyromellitic dianhydride and bis(3,4-dicarboxyphenyl)ether dianhydride.

As the organic polar solvent employable in the polymerization reaction, there can be mentioned solvents capable of homogeneously dissolving the monomers (aromatic diamine component and aromatic tetracarboxylic acid component), an oligomer produced by the monomers (aromatic diamine component and aromatic tetracarboxylic acid component), or a low molecular weight polyamic acid. Examples of such organic polar solvents include amide solvents such as N,N-dimethylformamide, N,N-dimethylacetamide, N-methyl-2-pyrrolidone, N-methyl-carprolactam, dimethyl-sulfoxide, hexamethylsulfolamide, dimethylsulfone, tetramethylenesulfone, dimethyltetra-methylenesulfone, ethylene glycol and tetramethylurea. These organic polar solvents can be used in combination with other solvents such as benzene, toluene, benzonitrile, xylene and dioxane.

The content of the aromatic polyamic acid in the organic polar solvent solution prepared as above is preferably in the range of 5 to 40 weight %, more preferably in the range of 30 to 40 weight %. The aromatic polyamic acid preferably has a logarithmic viscosity (measured at 30° C., concentration of 0.5 g/100 mL of solvent) of not less than 0.1, more preferably not less than 0.2.

The antistatic agent used in the present invention are electrically conductive particles which impart static dissipative properties to the aromatic polyimide film. The electrically conductive particles are prepared as described in U.S. Pat. No. 5,236,737. The electrically conductive particles are micron-sized particles of a silica-containing material surface coated with antimony-containing tin oxide crystallites in which the antimony content ranges from about 1 to about 20% by weight. The average diameter of the particles is on the order of from about 0.2 to 10 microns, preferably from about 1 to 4 microns.

The silica-containing material is, in general, a material having an extensive covalent network involving $SiO_4$ tetrahedra, thus offering the potential for surface hydroxyl formation. The preferred material is amorphous silica in the form of platelets or hollow shells. Platelets of silica-containing material can be formed by coating the material on flake-shaped particles such as mica. Hollow shells can be formed by coating a finely divided solid core material with active silica and then removing the core material without unduly disturbing the silica coating. In either case, the silica coating or shell should be relatively thin, less than 250 nanometers and, preferably, in the range of about 5 to 20 nanometers.

Suitable solid core materials are carbonates, for example, $BaCO_3$, $SrCO_3$ and $CaCO_3$. Other materials may also be used provided that they will readily accept an adherent skin of amorphous hydroxylated silica, they have low solubility at the coating conditions, they can be easily removed from the silica shell by a variety of techniques including extraction, reaction and oxidation, and their chemical composition will not interfere with application of the tin oxide coating.

In another aspect of the invention, the solid core material can remain encapsulated within the shell of amorphous silica, or silica-containing material, i.e., it is not removed. Examples of suitable core materials for this embodiment include $TiO_2$, mica, kaolin, talc and $BaSO_4$ wherein the silica coating is coherent and bound to the core material forming a coating layer which is substantially uniform in thickness from about 5 to 20 nanometers. In applications where transparency is a desirable feature of the polyimide polymer matrix or where flexibility in coloring the polyimide polymer matrix is important, then the core material for the electroconductive particles should have an index of refraction no higher than that of mica.

The silica-containing material is coated with a substantially two-dimensional network of densely packed antimony-containing tin oxide crystallites. The layer of such crystallites is typically about 5 to 20 namometers thick. The tin oxide crystallites contain from 1 to 20% by weight, preferably from 5 to 10% by weight, of antimony.

The electrically conductive particles are dispersed in the polyimide matrix polymer at such a concentration that a requisite amount of electrical conductivity is imparted to the matrix polymer and thus to the film structure. In order to obtain a coated polyimide film with a surface resistivity of from $10^4$ to $10^{12}$ ohms/square, the concentration of the electrically conductive particles in the matrix should range from 14 to 50% by weight, preferably from 30 to 40% by weight.

The resistivity of the film surface also depends in part on the thickness of the polyimide matrix layer containing the electrically conductive particles. Very thin layers will exhibit increased resistivity, and vice versa. In general, the thickness of the polyimide film ranges from 12 to 148 micrometers, preferably from 72 to 120 micrometers, and provides an optimum electrical resistivity of from $10^8$ to $10^{12}$ ohms/square.

A method of preparing an aromatic polyimide film from an organic polar solvent solution of an aromatic polyamic acid is generally known. The antistatic aromatic polyimide film of the present invention can be basically prepared utilizing the known method, that is, the aforementioned electrically conductive particles are incorporated into the organic polar solvent solution of the aromatic polyamic acid at an optional stage to prepare a polyamic solution containing the electrically conducting particles, and using the solution the antistatic aromatic polyimide film of the invention is prepared.

A self-supporting film is prepared from an organic polar solvent solution of an aromatic polyamic acid which contains the aforementioned electrically conductive particles using a casting method. The self-supporting film is heated at a temperature not lower than 275° C. to form an antistatic aromatic polyimide film.

More specifically, the electrically conducting antimony-containing tin oxide coated silica particles can be added at an optional stage in the preparation of the organic polar solvent solution of the aromatic polyamic acid. For example, the electrically conducting particles may be initially added to an organic polar solvent prior to performing the polymerization reaction of the aromatic tetracarboxylic acid component and the aromatic diamine component, or may be added during the polymerization reaction of those components in the organic polar solvent. Additionally, the electrically conductive particles may be added to the aromatic polyamic acid solution obtained after the polymerization reaction.

The self-supporting aromatic polyimide film can be prepared from the organic polar solvent solution of the aromatic polyamic acid containing the electrically conductive particles by a known process. For example, the organic polar solvent solution of the aromatic polyamic acid containing the dispersed electrically conductive particles is deaerated and uniformly cast onto a support such as a metal drum or belt through a T-die. The polyamic acid solution is then heated at a temperature of less than 200° C., preferably from 60° to 160° C., by applying hot air or infrared heating to gradually remove the solvent from the solution and form a self-supporting film containing from 25 to 35% of residual organic solvent.

Subsequently, the self-supporting film is subjected to a heat-treatment at a temperature of from 275° to 555° C., preferably from 300° to 500° C. for from 0.50 to 60 minutes to completely convert the polyamic acid to the polyimide.

The present invention is further illustrated by the following examples.

TABLE I

| GLOSSARY | | |
|---|---|---|
| ODPA | = | bis(3,4-dicarboxyphenyl) ether dianhydride |
| PMDA | = | pyromellitic dianhydride |
| ODA | = | 4,4'-diaminodiphenylether |
| DMAC | = | N,N-dimethylacetamide |
| Zelec ® ECP | = | antimony-doped tin oxide coated electrically conductive particles |

TABLE I

| Properties of Zelec ® Electrically Conducting Particles (ECP)* | | |
|---|---|---|
|  | 1610S | 3005 XC |
| Color | Lt. Gray | Green |
| Core | Silica Shell | None |
| Sb, % | 6.5 | 6.5 |
| Surface Area, m²/gm | 30–60 | 15–30 |
| Particles Size, D50, microns | 9 | 0.7 |

*Commercially available from E. I. du Pont de Nemours and Company

In the Examples, thickness measurements were made using an Ames Gauge, Model 122DB and surface resistivities were measured using a Pinion Voyager Meter, Model SRM 110. Film elongation was measured in accordance with ASTM-882-91, dielectric strength was measured using ASTM D-149-91 and dielectric constant values were obtained using ASTM-D-150-92. Film modulus, tensile strength and tear resistance were measured according to ASTM-D-1004-90.

EXAMPLE 1

This example illustrates an aromatic polyimide film prepared by thermal conversion of a polyamic acid obtained from the reaction of ODPA and ODA in DMAC solvent and containing 19.2% by weight of antimony-doped tin oxide coated silica particles (Zelec® ECP 1610S).

A 15% by weight solution of a polyamic acid was prepared by adding 0.10 mole of ODPA to 0.10 mole of ODA dissolved in DMAC over a 2 hour period. The Brookfield solution viscosity was 2100 poises at 25° C.

Zelec® ECP 1610S particles (3.33 g) and 25 mL of DMAC were stirred into 100 g of the polyamic acid solution. The resulting casting dope had a Brookfield solution viscosity of 485 poises at 25° C. and was allowed to stand for 18 hours to deaerate.

The casting dope was metered onto a Pyrex® glass plate using a casting rod and heated at 110° C. for 20 minutes to form a "green" or uncured film containing from 25 to 35% by weight of residual DMAC.

The "green" film was clamped onto a square, stainless steel frame and precured at 200° C. for 10 minutes, followed by complete curing at 275° C. for 30 minutes in a forced air oven. The resultant aromatic polyimide film was translucent-gray in appearance and had a thickness of 26.3 micrometers. The film had a surface resistivity of $10^7$ ohms/square and an elongation of 10.9%.

EXAMPLE 2

This example illustrates an aromatic polyimide film prepared by thermal conversion of a polyamic acid obtained from the reaction of PMDA and ODA in DMAC solvent and containing 16.8% by weight of antimony-doped tin oxide coated silica particles (Zelec® ECP 610S).

A 14.9% solids polyamic acid solution was prepared by adding 654 g (3 moles) of PMDA to 600 g (3 moles) of ODA dissolved in 7160 g of DMAC and 30 g of triphenylphosphite. The Brookfield solution viscosity was 1792 poises at 25° C.

Twenty five grams of Zelec® ECP 1610S particles were slurried into 75 g of DMAC. A casting dope was prepared by adding 15 g of the slurry to 100 g of the polyamic acid solution. The resulting casting dope had a Brookfield solution viscosity of 860 poises at 25° C.

A "green" film was prepared by heating a sheet cast on a Pyrex® glass plate for 20 minutes at 108° to 112° C. The "green" film was then cured by heating at 340° C. for 25 minutes to form the final polyimide film.

The resultant aromatic polyimide film had a thickness of 57.5 micrometers, a surface resistivity of $10^4$ ohms/square and an elongation of 13%.

EXAMPLE 3

Aromatic polyimide films were prepared by thermal conversion of a polyamic acid obtained from the reaction of PMDA and ODA in DMAC solvent, as described in Example 2, and containing varying amounts of electrically conductive antimony-doped tin oxide particles without the incorporation of a core particle (Zelec® ECP 3005 XC). Such conductive particles can be readily dispersed in a high shear mill to very small particle sizes without adversely affecting their conductive properties and are preferably used in aromatic polyimide films where high film clarity is a requirement. Table II summarizes the properties of the films.

TABLE II

| Example No. | Thickness (microns) | ECP3005XC (weight %) | Modulus (Kpsi) | Tensile Strength (Kpsi) | Elongation (%) | Tear Resistance (lbs/mil) | Surface Resistivity (ohms/sq.) |
|---|---|---|---|---|---|---|---|
| 3A | 72.8 | 33.2 | 470 | 18.1 | 56 | 2.75 | $10^{12}$ |
| 3B | 77.3 | 35.4 | 471 | 18.0 | 45 | 2.56 | $10^{11}$ |
| 3C | 75.8 | 36.6 | 478 | 17.9 | 47 | 2.38 | $10^{11}$ |
| 3D | 75.0 | 35.1 | 491 | 18.1 | 52 | 2.30 | $10^{12}$ |
| Control | 74.5 | 0 | 350 | 30.5 | 98 | 3.15 | $>10^{12}$ |

EXAMPLE 4

Aromatic polyimide films were prepared by thermal conversion of a polyamic acid obtained from the reaction of PMDA and ODA in DMAC solvent and containing electrically conductive Zelec® ECP 3005 XC particles as described in Example 3. The properties of the films are summarized in Table III.

TABLE III

| Example No. | ECP3005XC (weight %) | Thickness (microns) | Dielectric Strength (V/mil) | Dielectric Constant (1 Khz. 25° C.) | Surface Resistivity (ohms/sq.) |
|---|---|---|---|---|---|
| Control | 0 | 75 | 2575 | 3.5 | $>10^{12}$ |
| 4A | 23.8 | 75 | 915 | 10.6 | $10^{12}$ |
| 4B | 33.2 | 75 | 460 | 18.6 | $10^{12}$ |
| 4C | 35.1 | 75 | 460 | 23.5 | $10^{11}$ |
| 4D | 36.6 | 75 | 455 | 27.0 | $10^{11}$ |

In addition to good electrical conductivity, the polyimide films exhibited increased dielectric constant while still retaining sufficient dielectric strength making them useful as capacitor substrates.

EXAMPLE 5

To separate 100 g portions of a 20.3% by weight polyamic acid solution prepared from the reaction of PMDA and ODA in DMAC solvent were added, respectively, 7.7 g, 9.6 g and 11.5 g of antimony-doped tin oxide coated silica particles (Zelec® ECP 1610S).

Polyimide films were prepared using a thermal conversion process by casting the polyamic acid solutions onto Pyrex® glass plates, heating at 110° to 122° C. for 20 minutes to form self-supporting "green" films and then converting the "green" films into polyimide films by heating at 300° C. for 30 minutes. The properties of the resulting films are given in Table IV.

TABLE IV

| Example No. | ECP 1610S (Weight %) | Thickness (microns) | Surface Resistivity (ohms/sq.) |
|---|---|---|---|
| 5A | 29 | 71.3 | 7130 |
| 5B | 34 | 90.5 | 3300 |
| 5C | 38 | 66.5 | 1970 |

EXAMPLE 6

A 75 microns thick PMDA-ODA polyimide film was prepared containing 36% by weight of electrically conductive antimony-doped tin oxide particles (Zelec® ECP 3005 XC) as described in Example 3. The polyimide film was corona discharge treated at 100 ft./inch using a power setting of 6 kilowatts. The film surface resistivity decreased from $3\times10^{12}$ ohms/square to $5.5\times10^8$ ohms/square. The film exhibited good shelf life stability as evidenced by a surface resistivity of $5.4\times10^8$ ohms/square after 100 hours storage at ambient conditions (23° C., 50% RH). Accordingly, corona discharge treatment of the polyimide film containing electrically conductive antimony-doped tin oxide particles unexpectedly provides a 3 to 4 fold increase in electrical conductivity and the treatment remains permanent after storage at ambient conditions.

EXAMPLE 7

A 75 microns thick PMDA-ODA polyimide film was prepared containing 36% by weight of electrically conductive antimony-doped tin oxide particles (Zelec® ECP 3005 XC) as described in Example 3. The polyimide film had a surface resistivity of $3\times10^{12}$ ohms/square.

Film samples were heated, free-hanging, in air circulated ovens maintained at 400° C., 425° C. and 450° C. for from 5 to 15 minutes and the surface resistivities of the heat-treated films were measured as follows:

| Treatment Temp (°C.) | Exposure Time (min.) | Surface Resistivity (ohms/square) |
|---|---|---|
| 400 | 5 | $3.9 \times 10^{12}$ |
| 400 | 10 | $5.2 \times 10^{12}$ |
| 400 | 15 | $4.8 \times 10^{12}$ |
| 425 | 5 | $1.5 \times 10^{11}$ |
| 425 | 10 | $1.3 \times 10^{11}$ |
| 425 | 15 | $1/5 \times 10^{10}$ |
| 450 | 5 | $5.9 \times 10^{11}$ |
| 450 | 10 | $9.1 \times 10^{10}$ |
| 450 | 15 | $7.8 \times 10^{10}$ |
| CONTROL | — | $3.1 \times 10^{12}$ |

After storage for 15 days at ambient temperature, the surface resistivities of the heat-treated films returned to about the value of the untreated control film. Other properties of the heat-treated films were essentially unchanged as shown below:

| Treatment Temp. (°C.) | 25 | 400 | 450 |
|---|---|---|---|
| Treatment Time (min.) | — | 20 | 10 |
| Modulus (Kpsi) | 492 | 464 | 464 |
| Tensile Strength (Kpsi) | 18.1 | 19.2 | 18.7 |
| Elongation (%) | 47 | 55 | 42 |

Thus, the polyimide film exhibits excellent antistatic properties, i.e. surface resistivities of $10^{10}$ to $10^{12}$, even after being subjected to heat-treatment temperatures of 400° C. or above, while still maintaining its good heat resistance and mechanical properties.

EXAMPLE 8

A 15% by weight solution of a polyamic acid was prepared by the reaction of PMDA and ODA in DMAC solvent as described in Example 2. The Brookfield solution viscosity was 2495 poises at 25° C.

A 30% by weight slurry of Zelec® ECP 1610S particles in DMAC was prepared and introduced into 100 g portions of the polyamic acid solution. The resulting casting dopes were then thermally converted into polyimide films containing varying amounts of electrically conducting particles. Surface resistivities of the polyimide films were measured and are summarized in Table V.

TABLE V

| Example No. | ECP 1610S (weight %) | Thickness (microns) | Surface Resistivity (ohms/sq.) |
|---|---|---|---|
| 8A | 22.1 | 52.5 | $10^5$ |
| 8B | 20.4 | 52.5 | $10^5$ |
| 8C | 18.9 | 50.0 | $10^5$ |
| 8D | 17.5 | 57.5 | $10^5$ |
| 8E | 16.4 | 52.5 | $10^6$ |
| 8F | 16.3 | 52.5 | $10^6$ |
| 8G | 15.5 | 50.0 | $10^7$ |
| 8H | 15.4 | 52.5 | $10^8$ |
| 8I | 14.7 | 55.0 | $10^{11}$ |
| 8J | 14.6 | 47.5 | $10^{11}$ |

What is claimed is:

1. An antistatic aromatic polyimide film comprising an aromatic polyimide film having dispersed therein from 14 to 50% by weight, based on the weight of the polyimide, of electrically conductive silica particles coated with a layer of antimony-containing tin oxide, wherein the amount of antimony range from 1 to 20% by weight of the tin oxide, to provide a surface resistivity of from $10^4$ to $10^{12}$ ohms/square.

2. The antistatic aromatic polyimide film of claim 1 wherein the aromatic polyimide is prepared from the reaction of an aromatic diamine component and an aromatic tetracarboxylic acid component.

3. The antistatic aromatic polyimide film of claim 2 wherein the aromatic tetracarboxylic acid component comprises pyromellitic dianhydride.

4. The antistatic aromatic polyimide film of claim 2 wherein the aromatic tetracarboxylic acid component comprises bis(3,4-dicarboxyphenyl)ether dianhydride.

5. The antistatic aromatic polyimide film of claim 2 wherein the aromatic diamine component comprises 4,4'-diaminodiphenyl ether.

6. The antistatic aromatic polyimide film of claim 1 wherein the coated electrically conductive silica particles have an average particle size diameter ranging from 0.2 to 10 microns.

7. The antistatic aromatic polyimide film of claim 1 wherein the layer of antimony-containing tin oxide has a thickness ranging from 5 to 20 nanometers.

8. The antistatic aromatic polyimide film of claim 1 wherein the silica comprises amorphous silica in the form of hollow shells.

9. The antistatic aromatic polyimide film of claim 1 wherein the silica comprises amorphous silica in the form of platelets.

10. The antistatic aromatic polyimide film of claim 8 wherein the hollow silica shells are formed by coating a finely divided solid core material with amorphous silica and then removing the core material.

11. The antistatic aromatic polyimide film of claim 10 wherein the solid core material remains encapsulated within the shells of amorphous silica.

12. The antistatic aromatic polyimide film of claim 10 wherein the solid core material comprises barium carbonate, strontium carbonate or calcium carbonate.

13. The antistatic aromatic polyimide film of claim 11 wherein the solid core material comprises titanium dioxide, mica, kaolin, talc or barium sulfate.

14. The antistatic polyimide film of claim 2 wherein the aromatic polyimide is prepared from the reaction of pyromellitic dianhydride and 4,4'-diaminodiphenyl ether and which contains from 30 to 40% by weight of electrically conductive silica particles coated with a layer of antimony-containing tin oxide and has a surface resistivity ranging from $10^8$ to $10^{12}$ ohms/square.

* * * * *